(12) United States Patent
Agarwal

(10) Patent No.: US 8,310,290 B2
(45) Date of Patent: Nov. 13, 2012

(54) ADC HAVING IMPROVED SAMPLE CLOCK JITTER PERFORMANCE

(75) Inventor: Nitin Agarwal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 218 days.

(21) Appl. No.: 12/938,155

(22) Filed: Nov. 2, 2010

(65) Prior Publication Data

US 2011/0115536 A1    May 19, 2011

(30) Foreign Application Priority Data

Nov. 17, 2009   (IN) .............................. 2831/CHE/2009

(51) Int. Cl.
*H03L 7/06* (2006.01)

(52) U.S. Cl. .......................................... 327/158; 327/94

(58) Field of Classification Search .................... 327/91, 327/94, 149, 158
See application file for complete search history.

(56) References Cited

U.S. PATENT DOCUMENTS

| 6,867,627 B1 | 3/2005 | Murtagh |
| 7,161,402 B1 | 1/2007 | Sompur et al. |
| 7,325,175 B2 | 1/2008 | Momtaz |
| 7,332,940 B2 * | 2/2008 | Watanabe ........................ 327/94 |

* cited by examiner

*Primary Examiner* — Hai L Nguyen
(74) *Attorney, Agent, or Firm* — John J. Patti; Wade J. Brady, III; Frederick J. Telecky, Jr.

(57) ABSTRACT

In conventional analog-to-digital converter (ADC) systems, jitter can be a problem because of delay circuits within the sample signal path. Here, an ADC system is provided with a modified delay locked loop (DLL), namely having a variable delay and a fixed delay. The modification to the delay line of DLL enables the removal of delay circuits from the sample path, improve the overall signal to noise ration (SNR).

6 Claims, 3 Drawing Sheets

ADC HAVING IMPROVED SAMPLE CLOCK JITTER PERFORMANCE

CROSS-REFERENCE TO RELATED APPLICATIONS

This application claims priority from Indian Patent Application No. 2831/CHE/2009, filed Nov. 17, 2009, which is hereby incorporated by reference for all purposes.

TECHNICAL FIELD

The invention relates generally to an analog-to-digital converter (ADC) and, more particularly, to an ADC having a delay locked loop (DLL) adapted to improve the sample clock jitter performance.

BACKGROUND

Turning to FIG. 1A, a conventional ADC system 100 can be seen. In operation, the clock buffer 102 buffers a clock signal CLK, which is provided to DLL 104 and delay circuit 106. Delay 106 provides a sample signal SP to a sampling circuit (which is generally comprised of sampling switch SS and sampling capacitor CS) so that the sampling circuit can sample the analog input signal AIN. The DLL 104 (which is generally comprised of phase detector (PD) 116, charge pump 118, loop filter 120, and delay line 112) generates output signals from taps within delay line 112. Specifically, the delay line 112 is fully variable, having a set of buffers 114-1 to 114-N that are coupled in series with one another and controlled by the output signal from loop filter 120. From these output signals from the taps associated with buffers 114-1 to 114-N, clock generator 108 is able to generate clock signals for ADC 110 that each correspond to one of the taps from the delay line 112, with the first clock signal EDGE1 operating as the hold signal HOLD for ADC.

In FIGS. 1B and 1C, a timing diagram for system 100 can be seen. When the sample signal SP is logic high, the sample switch SS and the sample capacitor CS samples the analog input signal AIN. If the delay circuit 106 were removed from system 100 (which is assumed for FIG. 1B), the rising edge of signal EDGE1 from buffer 114-1 would lag the falling edge of the sampling signal SP, and the rising edge of hold signal HOLD output from clock generator 108 would lag the rising edge of signal EDGE1. With the delay circuit 106 in place (which is assumed for FIG. 1C), the falling edge of sample signal SP and the rising edge of signal EDGE1, yet the hold signal HOLD continues to lag signal EDGE1. Thus, it is desirable to include this delay to obtain the edge alignment, yet it also is desirable to eliminate delay circuit 106 to reduce jitter.

Since DLL 104 locks to the full period of clock signal CLK, one could potentially use phases generated at the end of delay line 112. In FIG. 1D, signal EDGE(N−1) from buffer 114-(N−1) is used as the hold signal HOLD. However, this technique is generally limited to a particular clock speed. At lower speeds (as shown in FIG. 1E), the delay for signal EDGE(N−1) changes but the delay difference between sampling clock SP and other logic delays for ADC do not change. Thus, the rising edge of signal EDGE(N−1) (after additional delay) occurs before the falling edge of the sampling clock SP and hold signal HOLD occurs before sampling clock, resulting in a functional failure. Essentially, because DLL 104 has N phases from the taps associated with buffers 114-1 to 114-N that are each separated by a delay of $T_{CLK}/N$ (where $T_{CLK}$ is period of clock signal CLK), the delay between the sampling clock SP and signal EDGE(N−1) is dependant on clock frequency $T_{CLK}$ so that the rising edge of signal EDGE (N−1) used for hold signal HOLD can occur prior to a falling edge of the sampling clock SP when the speed of clock signal CLK is reduced.

Some other conventional systems are: U.S. Pat. Nos. 6,867,627; 7,161,402; and 7,325,175.

SUMMARY

A preferred embodiment of the present invention, accordingly, provides an apparatus. The apparatus comprises a sampling circuit that receives an analog input signal and that is controlled by a clock signal; an analog-to-digital converter (ADC) that is coupled to the sampling circuit; a delay locked loop (DLL) that receives the clock signal, wherein the DLL has: a variable delay line that receives the clock signal and that has a plurality of taps; and a delay circuit having a fixed delay that is coupled to the variable delay line; and a clock generator that is coupled to each tap of the variable delay line, the delay circuit, and the ADC, wherein the clock generator generates a plurality of clock signals with each of the clock signals corresponding to an output from one of the taps or the delay circuit, and wherein the clock signal corresponding to one of the taps operates as a hold signal for the ADC.

In accordance with a preferred embodiment of the present invention, the apparatus further comprises a clock buffer that is coupled to the sampling circuit and the variable delay line.

In accordance with a preferred embodiment of the present invention, the sampling circuit further comprises: a sampling switch that receives the analog input signal and that is controlled by the clock signal; and a sampling capacitor that is coupled to the sampling switch and the ADC.

In accordance with a preferred embodiment of the present invention, the DLL further comprises: a phase detector (PD) that is coupled to the clock buffer; a charge pump that is coupled to the PD; and a loop filter that is coupled to the charge pump and the variable delay line.

In accordance with a preferred embodiment of the present invention, the variable delay line further comprises a plurality of buffer coupled in series with one another with each buffer being coupled to the loop filter.

In accordance with a preferred embodiment of the present invention, an apparatus is provided. The apparatus comprises a clock buffer that receives a clock signal; a sampling switch that receives an analog input signal and that is coupled to the clock buffer, wherein the clock buffer controls by the sampling switch; a sampling capacitor that is coupled to the sampling switch; an ADC that is coupled to the sampling capacitor; a DLL having: a PD that is coupled to the clock buffer; a charge pump that is coupled to the PD; a loop filter that is coupled to the charge pump; a delay line that is coupled to the phase detector, wherein the PD has: a set of buffers coupled in series with one another, wherein the first buffer of the set of buffers is coupled to clock buffer, and wherein each buffer has a variable delay, and wherein each buffer from the set of buffers is coupled to the loop filter so the length of its variable delay controlled by the loop filter; and a delay circuit having a fixed delay that is coupled to the last buffer from the set of buffer; and a clock generator that is coupled to each of the buffers, the delay circuit, and the ADC, wherein the clock generator generates a plurality of clock signals with each of the clock signals corresponding to an output from one of the buffers or the delay circuit, and wherein the clock signal corresponding to one of the taps operates as a hold signal for the ADC.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
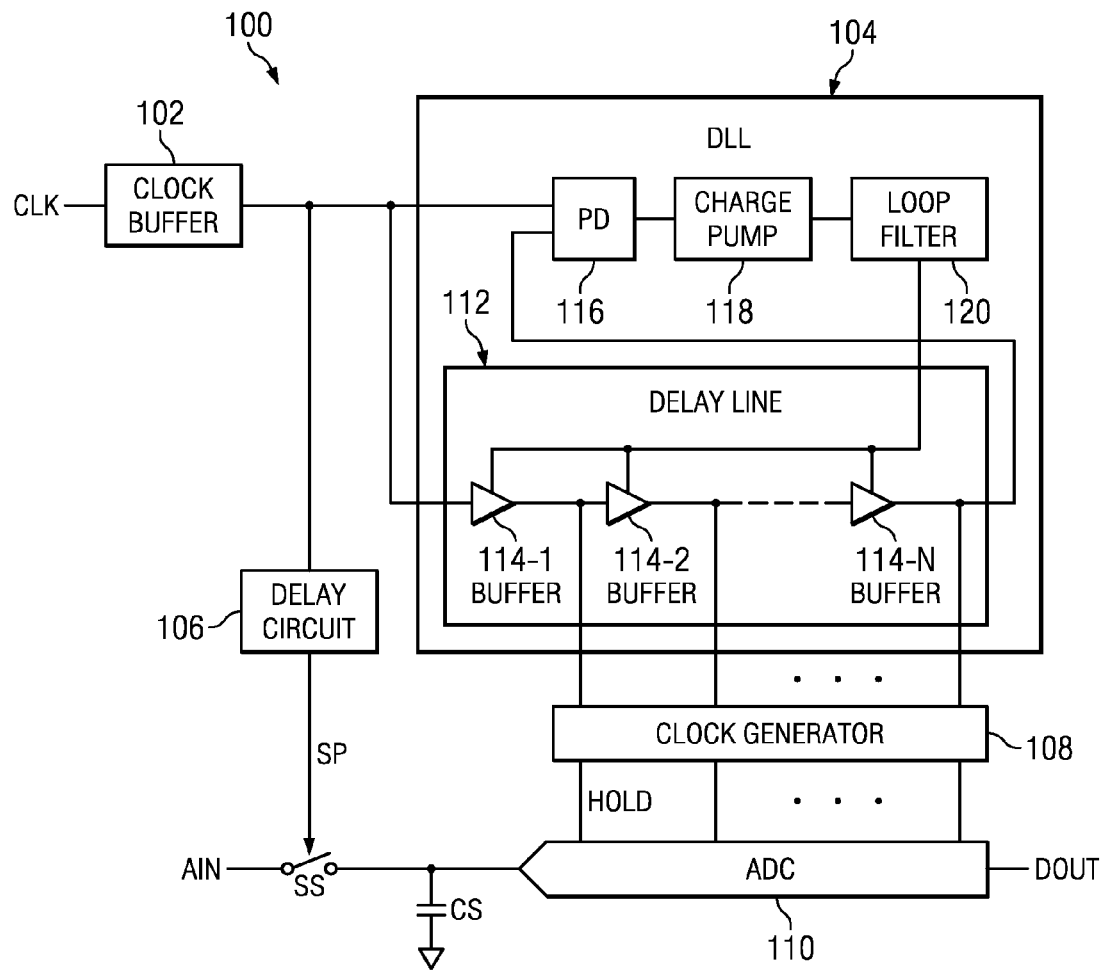
FIG. 1A is an example of a conventional ADC system.
Figure 1B:
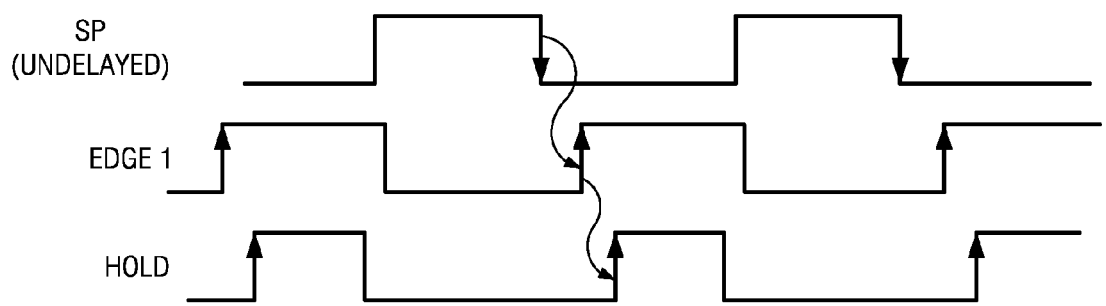
FIGS. 1B through 1E are timing diagrams for the system of FIG. 1.
Figure 1C:
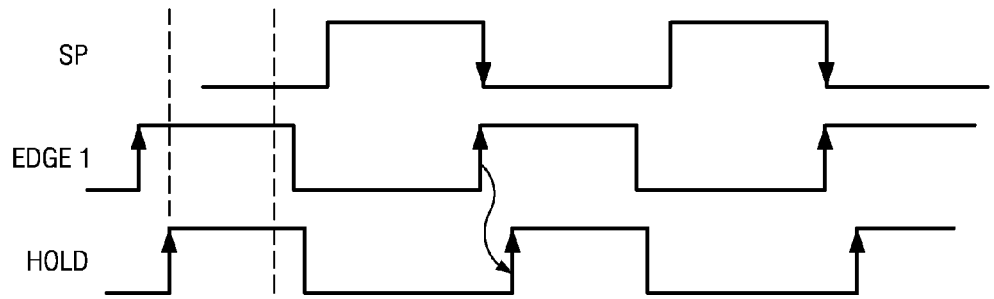
Figure 1D:
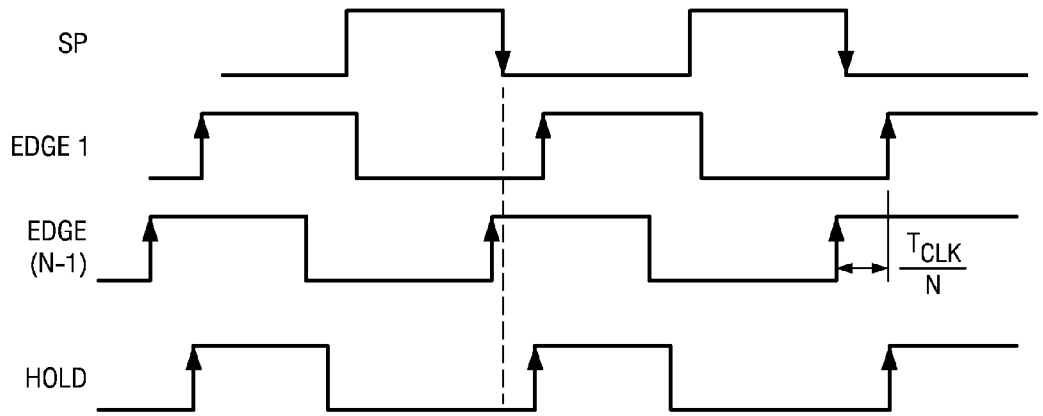
Figure 1E:
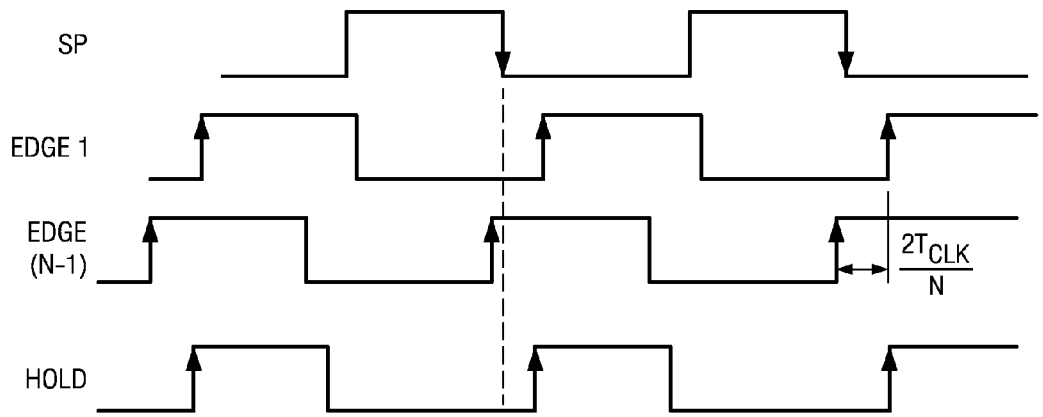

Refer now to the drawings wherein depicted elements are, for the sake of clarity, not necessarily shown to scale and wherein like or similar elements are designated by the same reference numeral through the several views.

Figure 2A:
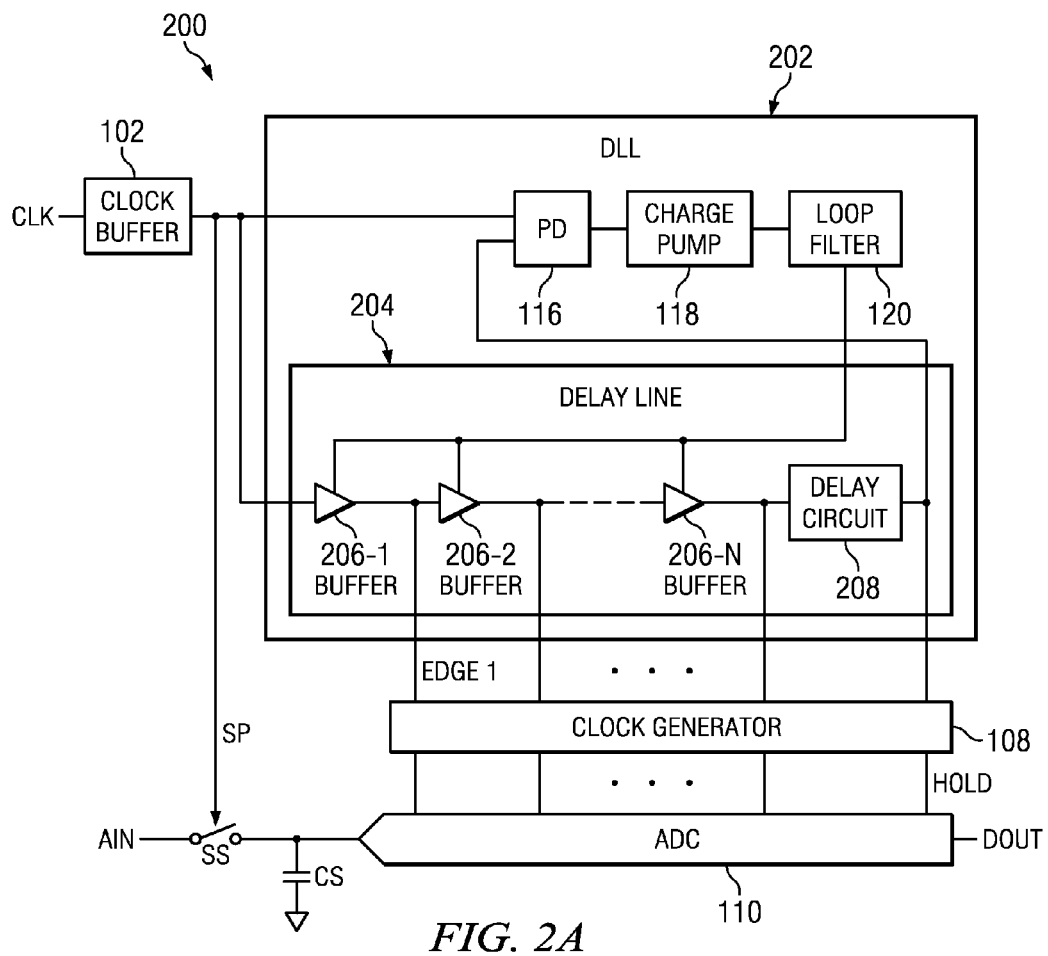
FIG. 2A is an example of an ADC system in accordance with a preferred embodiment of the present invention.

Referring to FIG. 2A of the drawings, the reference numeral 200 generally designates an ADC system in accordance with a preferred embodiment of the present invention. System 200 uses many of the same components as system 100, but system 200 lacks delay circuit 106 and DLL 202 has a different configuration from DLL 104. Namely, the difference between DLL 104 and DLL 204 lies in the delay line 204. Delay line 204 is generally comprised of a variable delay (which is generally comprised of buffers 206-1 to 205-M coupled in series with one another) and delay circuit 208 (which has a fixed delay).

Figure 2B:
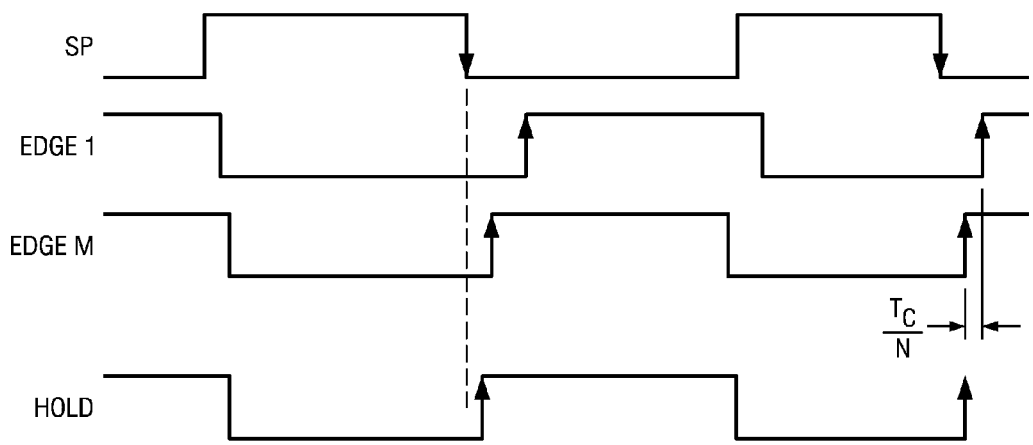
FIG. 2B is an example of a timing diagram for the system of FIG. 2A.

Explicitly as shown in FIGS. 2A and 2B, system 200 is designed to reduce the amount of logic in sampling signal SP path to reduce jitter (compared to system 100) and achieve a better signal-to-noise ration (SNR) without sacrificing the performance of the ADC 110. Here, the rising edge of the fixed delay from delay circuit 208 or signal EDGE(delay) occurs earlier than sampling clock SP. DLL 202 has M-k normal phases (from taps associated with buffers 206-1 to 206-(M-k)) with there respective delay changing with the period $T_{CLK}$ of clock signal CLK, and remaining phases (from taps associated with buffers 206-(M-k+1) to 206-M) have clock frequency independent delays. If the clock path through DLL 202 has an extra delay (associated with delay circuit 208), where a suitable phase (i.e, tap associated with buffer 206-M or signal EDGEM) of DLL 202 is used for hold signal HOLD, then the delay between the falling edge of sampling clock SP to the rising edge of the hold signal HOLD is generally constant ($T_C/N$) across frequencies of the clock signal CLK. Effectively, DLL 202 generates a "negative constant delay" at least partially because of logic and routing buffers in the clock generator 108.

As a result of the configuration of system 200, there is 3 db increase in SNR at high input frequency because of improved jitter. This is generally achieved reducing the number of the inverters and buffers in path for sample signal SP and by reducing delay of remaining inverters and buffers (by increasing their strength).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a sampling circuit that receives an analog input signal and that is controlled by a clock signal;
an analog-to-digital converter (ADC) that is coupled to the sampling circuit;
a delay locked loop (DLL) that receives the clock signal, wherein the DLL has:
a variable delay line that receives the clock signal and that has a plurality of taps; and
a delay circuit having a fixed delay that is coupled to the variable delay line; and
a clock generator that is coupled to each tap of the variable delay line, the delay circuit, and the ADC, wherein the clock generator generates a plurality of clock signals with each of the clock signals corresponding to an output from one of the taps or the delay circuit, and wherein the clock signal corresponding to one of the taps operates as a hold signal for the ADC.

2. The apparatus of claim 1, wherein the apparatus further comprises a clock buffer that is coupled to the sampling circuit and the variable delay line.

3. The apparatus of claim 1, wherein the sampling circuit further comprises:
a sampling switch that receives the analog input signal and that is controlled by the clock signal; and
a sampling capacitor that is coupled to the sampling switch and the ADC.

4. The apparatus of claim 1, wherein the DLL further comprises:
a phase detector (PD) that is coupled to the clock buffer;
a charge pump that is coupled to the PD; and
a loop filter that is coupled to the charge pump and the variable delay line.

5. The apparatus of claim 4, wherein the variable delay line further comprises a plurality of buffer coupled in series with one another with each buffer being coupled to the loop filter.

6. An apparatus comprising:
a clock buffer that receives a clock signal;
a sampling switch that receives an analog input signal and that is coupled to the clock buffer, wherein the clock buffer controls by the sampling switch;
a sampling capacitor that is coupled to the sampling switch;
an ADC that is coupled to the sampling capacitor;
a DLL having:
a PD that is coupled to the clock buffer;
a charge pump that is coupled to the PD;
a loop filter that is coupled to the charge pump;
a delay line that is coupled to the phase detector, wherein the PD has:

a set of buffers coupled in series with one another, wherein the first buffer of the set of buffers is coupled to clock buffer, and wherein each buffer has a variable delay, and wherein each buffer from the set of buffers is coupled to the loop filter so the length of its variable delay controlled by the loop filter; and a delay circuit having a fixed delay that is coupled to the last buffer from the set of buffer; and a clock generator that is coupled to each of the buffers, the delay circuit, and the ADC, wherein the clock generator generates a plurality of clock signals with each of the clock signals corresponding to an output from one of the buffers or the delay circuit, and wherein the clock signal corresponding to one of the taps operates as a hold signal for the ADC.

* * * * *